US008415981B2

(12) United States Patent
Ivory

(10) Patent No.: US 8,415,981 B2
(45) Date of Patent: Apr. 9, 2013

(54) INTEGRATED CIRCUIT DEVICE, SYNCHRONISATION MODULE, ELECTRONIC DEVICE AND METHOD THEREFOR

(75) Inventor: David Stephen Ivory, Huntingdon (GB)

(73) Assignee: MediaTek Singapore Pte. Ltd., Solaris, Singapore (SG)

( * ) Notice: Subject to any disclaimer, the term of this patent is extended or adjusted under 35 U.S.C. 154(b) by 0 days.

(21) Appl. No.: 13/541,758

(22) Filed: Jul. 4, 2012

(65) Prior Publication Data

US 2013/0043904 A1 Feb. 21, 2013

Related U.S. Application Data

(60) Provisional application No. 61/523,810, filed on Aug. 15, 2011.

(51) Int. Cl.
*H03K 19/20* (2006.01)

(52) U.S. Cl.
USPC ................................................ 326/93; 327/99

(58) Field of Classification Search ........................ None
See application file for complete search history.

(56) References Cited

U.S. PATENT DOCUMENTS

| 6,784,699 | B2 * | 8/2004 | Haroun et al. | 327/99 |
| 2008/0094108 | A1 * | 4/2008 | Leon | 327/99 |

* cited by examiner

*Primary Examiner* — Crystal L Hammond
(74) *Attorney, Agent, or Firm* — Winston Hsu; Scott Margo

(57) ABSTRACT

An integrated circuit device includes at least a functional module arranged to receive a reference clock signal; a gating component configurable to perform gating of the reference clock signal; and a synchronization module. The synchronization module includes a trigger component arranged to receive a request for the functional module, the request being asynchronous with the reference clock signal, and to set an enable signal for the functional module in response to receiving the request therefor; and a synchronization component arranged to receive the enable signal, and in response to the enable signal being set to: configure the gating component to un-gate the reference clock signal; and synchronize an initial clock cycle of the reference clock signal received by the functional module following the reference clock signal being un-gated.

20 Claims, 4 Drawing Sheets

INTEGRATED CIRCUIT DEVICE, SYNCHRONISATION MODULE, ELECTRONIC DEVICE AND METHOD THEREFOR

CROSS REFERENCE TO RELATED APPLICATIONS

This application claims the benefit of U.S. provisional application No. 61/523,810, filed on Aug. 15, 2011 and incorporated herein by reference.

BACKGROUND

The field of this invention relates to an integrated circuit device, a synchronisation module, an electronic device and a method therefor. The invention is applicable to, but not limited to, a method and apparatus for synchronising an asynchronous clock request.

In the field of digital electronic devices, a synchronous circuit is a digital circuit in which the various parts are synchronized by a clock signal. For many digital applications, for example within the field of mobile communications etc, digital electronic devices are required to meet tight power consumption restrictions.

Clock gating is a popular technique used in many synchronous circuits for reducing dynamic power dissipation. Clock gating saves power by adding logic to a circuit to 'prune' the clock tree. Pruning the clock tree disables portions of the circuitry so that the storage elements do not have to switch states. When not being switched, the switching power consumption of a storage element goes to zero, and only leakage currents are incurred. An additional benefit of clock gating is that it also enables noise within the electronic device to be reduced.

Typically, a digital electronic device may comprise multiple clock domains, wherein each clock domain comprises one or more synchronous circuits synchronized to at least a common reference clock signal. Synchronization between different clock domains is a common requirement in digital designs. However, when the clock domains are discontinuous in order to keep the power and noise to a minimum, for example through clock gating or the like, maintaining synchronization between the different clock domains becomes difficult. For example, asynchronously 'waking-up' a gated clock domain can lead to a 'runt' pulse within the initial clock cycle. For example, such a runt pulse may comprise a partial pulse capable of triggering state switches within the clock domain, but of insufficient duration to allow sufficient time for signals to propagate fully through the clock domain logic.

Maintaining at least one clock alive within each clock domain enables synchronization to be maintained between different clock domains, and thus helps to avoid runt pulses. For example, a reference clock may be maintained within each clock domain, with clock gating being implemented within downstream circuitry to reduce power and noise. However, this approach inherently limits the effectiveness of clock gating within the clock domains since a reference clock signal is required to be maintained for each clock domain.

Implementing clock gating at the source end of the clock supply enables the benefit of such clock gating in relation to power consumption of the respective clock domain to be maximised. Conventionally, such source end clock gating requires sequential logic to be provided at the clock source to enable synchronous un-gating of the supply clock in response to an asynchronous request, and thus alleviate the problem of runt pulses. However, such sequential logic at the clock source can generate unwanted noise in sensitive circuits. However, omitting such sequential logic at the clock generator could lead to 'runt' pulses at the first cycle following asynchronous un-gating of the clock supply.

An alternative method for removing runt pulses comprises clocking a request signal by the output of a control module to generate a request and using a set of, say, flip-flops to delay the output of the clock gate to remove the runt pulse. However, such a method involves the flip-flops being clocked from non clock signals. Attaching non-clock signals to clock pins is a potential problem as it may violate design rules, is considered bad practice and may be prone to glitches if the source is from decoded logic.

Metastable filtering is a simple approach for continuous asynchronous clocks, for example using a pair of flip-flops in sequence. The reference clock can then be gated locally by the synchronized control signal. However, such a solution requires continuous clocks since the sending and receiving clocks must be on at the same time, again limiting the effectiveness of clock gating.

Thus, a need exists for an improved apparatus for synchronising an asynchronous clock request and method of operation therefor.

SUMMARY

Accordingly, the invention seeks to mitigate, alleviate or eliminate one or more of the above mentioned disadvantages singly or in any combination. Aspects of the invention provide an integrated circuit, a synchronisation module and an electronic device comprising such a synchronisation module, and a method therefor as described in the appended claims.

According to a first aspect of the invention, there is provided an integrated circuit device comprising: at least one functional module arranged to receive at least one reference clock signal; at least one gating component configurable to perform gating of the at least one reference clock signal; and at least one synchronisation module. The at least one synchronisation module comprises: at least one trigger component arranged to receive at least one request for the at least one functional module, the at least one request being asynchronous with the at least one reference clock signal, and to set at least one enable signal for the at least one functional module in response to receiving the at least one request therefor; and at least one synchronisation component arranged to receive the at least one enable signal, and in response to the at least one enable signal being set to: configure the at least one gating component to un-gate the at least one reference clock signal; and synchronize an initial clock cycle of the reference clock signal received by the at least one functional module following the reference clock signal being un-gated.

Thus, in one embodiment of the invention, a gating component such as, say, a simple combinational logic gate or enabled buffer, may be configured to un-gate a reference clock signal in response to receipt of an request, and an initial clock cycle of the reference clock signal after being un-gated may be synchronized to clean any runt pulse that may occur due to the asynchronous un-gating thereof.

According to an optional feature of the invention, the at least one trigger component may further be arranged to receive at least one release signal from the at least one functional module, and to reset the at least one enable signal for the at least one functional module in response to receiving the at least one release signal therefrom. Additionally, the at least one synchronisation component may further be arranged to configure the at least one gating component to gate the at least one reference clock signal upon no enable signal being set.

Thus, and in one embodiment of the invention, enable signals set following receipt of a respective request signal may be reset upon the respective functional module finishing the requested function. Accordingly, the amount of time the reference clock signal is un-gated may be limited to substantially only whilst at least one of the functional module is performing a requested/required function; thus amount of time the clock domain is inactive may be substantially maximised.

According to an optional feature of the invention, the at least one trigger component may comprise a latching component comprising: a first input arranged to receive the at least one request; a second input arranged to receive a reset signal; and an output arranged to output the at least one enable signal. The at least one latching component may be arranged to set and latch the at least one enable signal in response to receiving the at least one request, and to reset the at least one enable signal in response to receiving the reset signal. For example, the latching component may comprise: a clock enable input arranged to receive the at least one request; a reset input arranged to receive the reset signal; and a data input arranged to receive a set value; a clock input arranged to receive a clock signal; and an output arranged to set/reset the at least one enable signal in accordance with the received input signals.

According to an optional feature of the invention, the at least one trigger component may further comprise a reset component. The reset component may comprise: an input arranged to receive the at least one release signal from the at least one functional module; and an output arranged to output the reset signal; wherein the reset component is arranged to output a synchronous reset signal to the trigger component upon receipt of a release signal from the at least one functional module. For example, the reset component may comprise at least a first latching component. The at least a first latching component may comprise: a first input arranged to receive the at least one release signal from the at least one functional module; a second input arranged to receive a clear value; a clock input arranged to receive a clock signal; and an output arranged to output a reset signal comprising, in response to an active clock edge, a reset value upon receipt of the release signal, and the clear value otherwise. The reset component may comprise at least one further latching component sequentially coupled to the at least first latching component. The at least one further latching component may comprise: a first input arranged to receive the at least one reset signal from the at least one functional module; a second input arranged to receive a value signal by a previous latching component; a clock input arranged to receive a clock signal; and an output arranged to output a reset signal comprising, in response to an active clock edge, a reset value upon receipt of the release signal, and the value output by the preceding latching component otherwise. A reset signal that is output by a last of the at least one further latching components may comprise a reset signal output to the trigger component.

According to an optional feature of the invention, the integrated circuit device may comprise: a plurality of functional modules each arranged to receive at least one reference clock signal; at least one gating component configurable to perform gating of the at least one reference clock signal; and at least one synchronisation module. The at least one synchronisation module may comprise: a plurality of trigger components, each trigger component arranged to receive at least one request for at least one of the functional modules, and to set at least one enable signal for the at least one functional module in response to receiving the at least one request therefor; and at least one synchronisation component arranged to receive at least an indication of at least one enable signal being set by at least one of the trigger components, and in response to at least one enable signal being set to: configure the at least one gating component to un-gate the at least one reference clock signal; and synchronize an initial clock cycle of the reference clock signal received by the at least one functional module following the reference clock signal being un-gated.

According to an optional feature of the invention, the synchronisation module may comprise a combinational logic (N)OR gate arranged to receive enable signals output by the plurality of trigger components, and to output to the at least one synchronisation component an indication of whether at least one trigger component has set an enable signal.

According to an optional feature of the invention, the at least one gating component may be configurable to perform gating of the at least one reference clock signal remotely upstream of the at least functional module.

According to an optional feature of the invention, the at least one gating component may be located proximate to a generator component for the at least one reference clock signal.

According to an optional feature of the invention, the at least one gating component may comprise at least one of a combinational logic gate and an enabled buffer.

According to an optional feature of the invention, the synchronisation component may comprise: a first input arranged to receive at least an indication of an enable signal output by the at least one trigger component; a second input arranged to receive the at least one reference clock signal output by the at least one clock gating component; a first output arranged to output at least one configuration signal to the at least one clock gating component; and a second output arranged to output a clean clock reference signal.

According to a second aspect of the invention, there is provided a synchronisation module comprising: at least one trigger component arranged to receive at least one request for at least one functional module, the at least one request being asynchronous with at least one reference clock signal of the at least one functional module, and to set at least one enable signal for the at least one functional module in response to receiving the at least one request therefor; and at least one synchronisation component arranged to receive the at least one enable signal, and in response to the at least one enable signal being set to: configure at least one gating component to un-gate the at least one reference clock signal; and synchronize an initial clock cycle of the reference clock signal received by the at least one functional module following the reference clock signal being un-gated.

According to a third aspect of the invention, there is provided an electronic device comprising: at least one functional module arranged to receive at least one reference clock signal; at least one gating component configurable to perform gating of the at least one reference clock signal; and at least one synchronisation module. The at least one synchronisation module comprises: at least one trigger component arranged to receive at least one request for the at least one functional module, the at least one request being asynchronous with the at least one reference clock signal, and to set at least one enable signal for the at least one functional module in response to receiving the at least one request therefor; and at least one synchronisation component arranged to receive the at least one enable signal, and in response to the at least one enable signal being set to: configure the at least one gating component to un-gate the at least one reference clock signal; and synchronize an initial clock cycle of the reference clock signal received by the at least one functional module following the reference clock signal being un-gated.

According to a fourth aspect of the invention, there is provided a method of synchronising an asynchronous clock request, the method comprising: receiving at least one request for at least one functional module, the at least one request being asynchronous with at least one reference clock signal of the at least one functional module; setting at least one enable signal for the at least one functional module in response to receiving the at least one request therefor; and in response to the at least one enable signal being set: configuring at least one gating component to un-gate at least one reference clock signal; and synchronising an initial clock cycle of the at least one reference clock signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Examples of the invention will be described in terms of a wireless communication unit. However, it will be appreciated by a skilled artisan that the inventive concept herein described may be embodied in any type of electronic device comprising, for example, multiple clock domains. In a number of applications, the adaptation of a synchronisation module in accordance with the examples of the invention effectively performs a method of synchronising an asynchronous clock request. The method comprises receiving at least one request for at least one functional module, the at least one request being asynchronous with at least one reference clock signal of the at least one functional module; setting at least one enable signal for the at least one functional module in response to receiving the at least one request therefor, and in response to the at least one enable signal being set: configuring at least one gating component to un-gate at least one reference clock signal; and synchronising an initial clock cycle of the at least one reference clock signal.

In this manner, and as outlined in greater detail below, a gating component such as, say, a simple combinational logic gate or enabled buffer, may be configured to un-gate a reference clock signal in response to receipt of an request, and an initial clock cycle of the reference clock signal after being un-gated may be synchronized to clean any runt pulse that may occur due to the asynchronous un-gating thereof.

Figure 1:
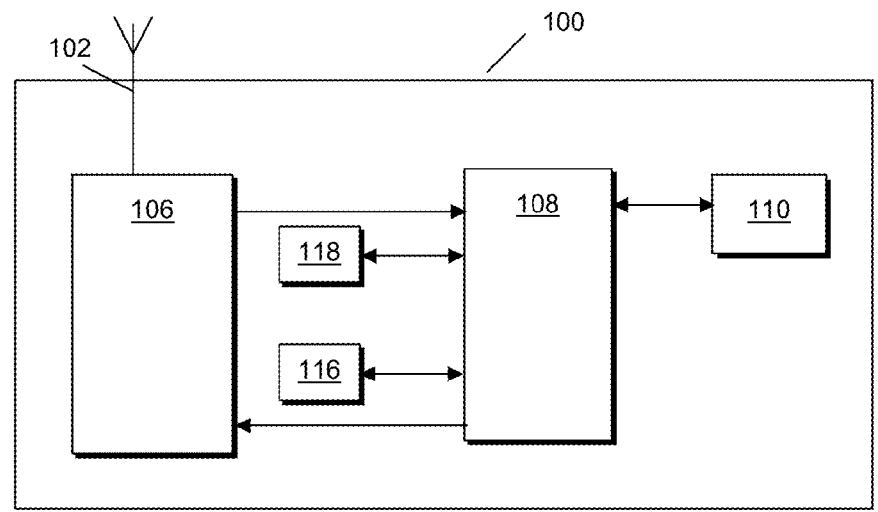
FIG. 1 illustrates an example of a simplified block diagram of part of an electronic device.

Referring to FIG. 1, there is illustrated an example of a simplified block diagram of part of an electronic device 100 adapted to support the inventive concepts of an example of the present invention. The electronic device 100, in the context of the illustrated embodiment of the invention, is a wireless communication unit such as a mobile telephone handset comprising an antenna 102. As such, the communication unit 100 contains a variety of well known radio frequency components or circuits 106, operably coupled to the antenna 102 that will not be described further herein. The communication unit 100 further comprises signal processing logic 108. An output from the signal processing logic 108 is provided to a suitable user interface (UI) 110 comprising, for example, a display, keypad, microphone, speaker, etc.

For completeness, the signal processing logic 108 is coupled to a memory element 116 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 118 is typically coupled to the signal processing logic 108 to control the timing of operations within the communication unit 100.

Electronic devices such as the communication unit 100 of FIG. 1 often comprise multiple clock domains and synchronous circuits, and are also typically required to meet tight power consumption restrictions. Clock gating is a popular technique used in many synchronous circuits for reducing dynamic power dissipation. Clock gating saves power by adding logic to a circuit to 'prune' the clock tree. Pruning the clock tree disables portions of the circuitry so that the storage elements do not have to switch states. When not being switched, the switching power consumption of a storage element goes to zero, and only leakage currents are incurred. An additional benefit of clock gating is that it also enables noise within the electronic device to be reduced. Synchronization between different clock domains is a common requirement in digital designs. However, when the clock domains are discontinuous in order to keep the power and noise to a minimum, for example through clock gating or the like, maintaining synchronization between the different clock domains becomes difficult.

Figure 2:
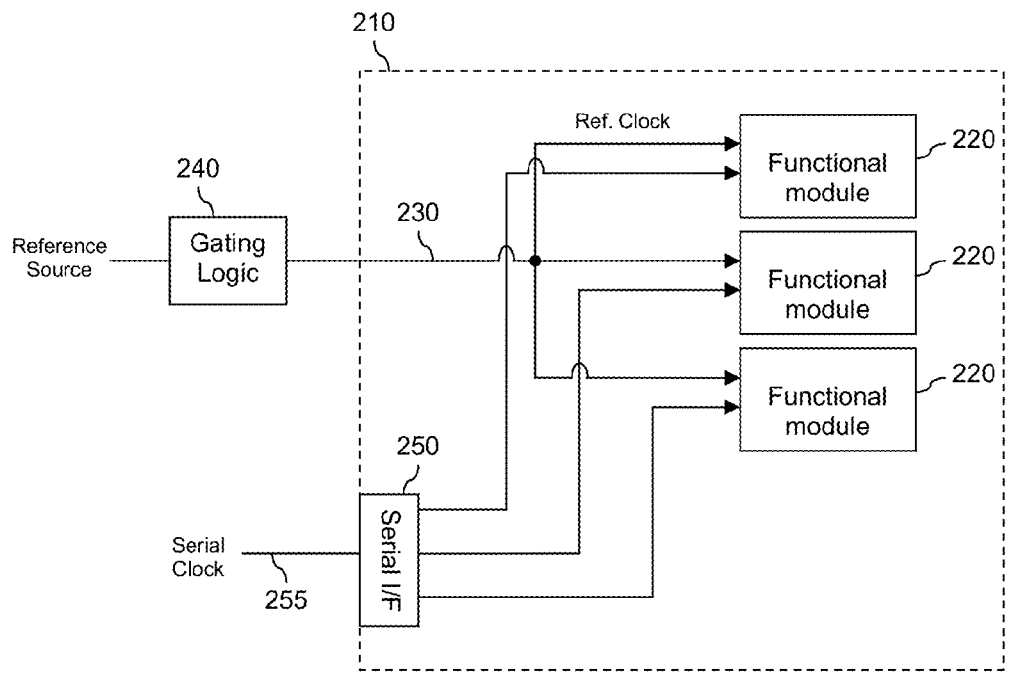
FIG. 2 illustrates an example of a simplified block diagram of a clock domain.

For example, and as illustrated in FIG. 2, a clock domain 210 within the communication device 100 may comprise one or more functional modules 220; each functional module 220 being arranged to receive at least one reference clock signal ('Ref. Clock') 230. Typically, in order to maximize the effectiveness of clock gating, a clock gating component/gating logic 240 may be implemented towards the source of the reference clock signal 230, i.e., the Reference Source denoted in FIG. 2, and thus remotely from the clock domain 210. In order to enable interaction between the functional modules 220 of the clock domain 210 illustrated in FIG. 2 and other clock domains (not shown) within, for example, the communication device 100 of FIG. 1, a serial interface (Serial I/F) 250 is provided via which communication between the clock domains may be provided. The serial interface 250 is arranged to receive requests etc. synchronized to a serial clock signal 255.

However, if the reference clock signal 230 has been gated such that the clock domain 210 has been effectively put to sleep, it is necessary to provide a mechanism by which an asynchronous request from, say, another clock domain is able to 'wake-up' the clock domain 210.

Figure 3:
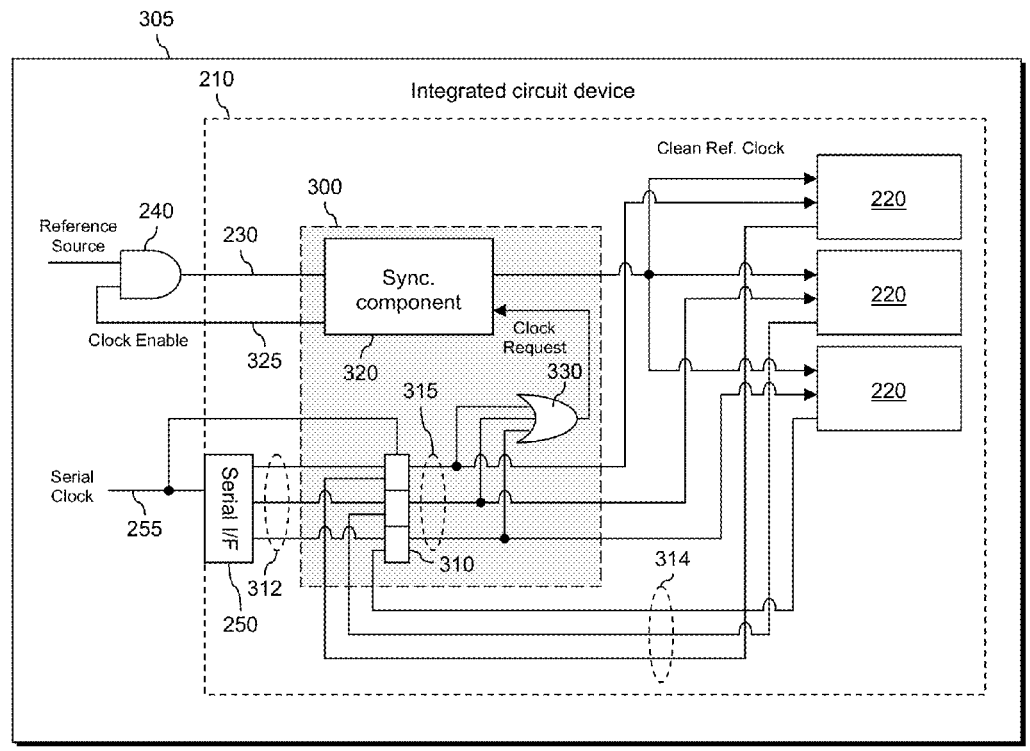
FIG. 3 illustrates a simplified block diagram of an example of a synchronisation module.

Referring now to FIG. 3, there is illustrated a simplified block diagram of an example of a synchronisation module 300 adapted in accordance with an example of the present invention. For the illustrated example, the synchronisation module 300 forms an integral part of the clock domain 210, which in turn is implemented within an integrated circuit device 305. The synchronisation module 300 comprises, for the illustrated example, a plurality of trigger components 310. Each trigger component 310 is arranged to receive, via the serial interface (Serial I/F) 250, asynchronous request signals 312 for one or more of the functional modules 220, and to set at least one enable signal 315 for the respective functional module 220 in response to receiving an asynchronous request signal 312 therefor. For simplicity, the synchronisation module 300 illustrated in FIG. 3 comprises one trigger component 310 for each functional module 220.

The synchronisation module 300 further comprises a synchronisation component 320 arranged to receive enable signals 315 output by the trigger components 310, and in response to the at least one enable signal 315 being set to configure, for example via clock enable signal ('Clock Enable') 325, the gating component 240 to un-gate the reference clock signal 230, and synchronize (as described in greater detail below with reference to FIG. 5) an initial clock cycle of the reference clock signal ('Clean Ref. Clock') received by the functional modules 220 following the reference clock signal 230 being un-gated. Specifically for the illustrated example, the synchronisation module 300 comprises a combinational logic OR gate 330 arranged to receive enable signals 315 output by the plurality of trigger components 310, and to output to the synchronisation component 320 an indication ('Clock Request') of whether at least one trigger component 310 has set an enable signal 315. For the illustrated example, an enable signal 315 is 'set' by configuring the enable signal 315 to a '1' value. In this manner, if any one of the enable signals 315 is set, the combinational logic OR gate 330 will output a '1' value indicating that at least one enable signal 315 has been set. However, it will be appreciated that, in some alternative examples, an enable signal 315 may be 'set' by configuring the enable signal 315 to a '0' value. In such cases, the combinational logic OR gate 330 may be replaced with a NOR gate such that, if any one of the enable signals is set, the NOR gate will output a '0' value indicating that at least one enable signal 315 has been set.

In this manner, an asynchronous request signal 312 received via, for the illustrated example, the serial interface 250 is able to wake-up the reference clock signal 230, with any runt pulse that may occur within the reference clock signal 230 following being woken up in response to such an asynchronous request signal being removed from the reference clock signal 230 prior to being received by the functional module 220. Significantly, because any resulting runt pulses are removed from the reference clock signal 230 by the synchronisation component 320, the gating component 240 may be implemented towards the source of the clock reference signal 230 by way of, say, a simple combinational logic component, an enabled buffer, or other equivalent component. In this manner, the benefit of such clock gating in relation to the power consumption of the respective clock domain 210 may be substantially maximised, without the need to use sequential logic to implement the clock gating, thereby avoiding the inherent unwanted noise generated by such sequential logic.

Thus, and as illustrated in FIG. 3, the gating component 240 may be located proximate to a generator component (not shown) for the reference clock signal 230. In this manner, the gating component 240 may be configurable to perform gating of the reference clock signal 230 remotely upstream of the clock domain 210, and thus remotely upstream of the functional modules 220.

Each trigger component 310 illustrated in FIG. 3 is further arranged to receive a 'done' request signal 314 from the respective functional module 220, and to reset the respective enable signal 315 for the respective functional module 220 in response to receiving a release signal (i.e., a 'Done' request signal 314) therefrom. In additional, the synchronisation component 320 is further arranged to configure the gating component 240 to gate the reference clock signal 230 upon no enable signal 315 being set. In this manner, each functional module 220 is able to reset the respective enable signal 315 output by the respective trigger component 310, for example once the functional module 220 has finished performing a requested function. As such, the enable signals 315 set following receipt of a respective request signal 312 may be reset upon the respective functional module 220 finishing the requested function. Accordingly, the amount of time the reference clock signal 230 is un-gated may be limited to substantially only whilst at least one of the functional modules 220 is performing a requested/required function; thus amount of time the clock domain 210 is inactive may be substantially maximised.

Figure 4:
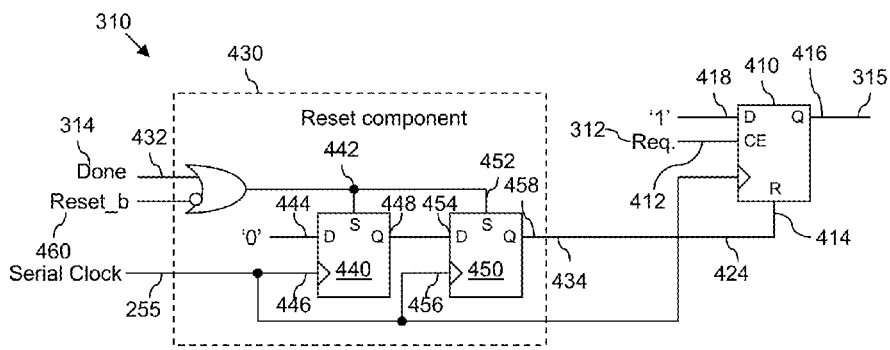
FIG. 4 illustrates a simplified block diagram of an example of a trigger component of the synchronisation module of FIG. 3.

Referring now to FIG. 4 there is illustrated a simplified block diagram of an example of a trigger component 310. For the illustrated example, the trigger component 310 comprises a latching component 410, which comprises a first input 412 arranged to receive a request signal ('Req.') 312, a second input 414 arranged to receive a reset signal 424, and an output 416 arranged to output an enable signal 315. The latching component 410 is arranged to set and latch the enable signal 315 in response to receiving a request signal 312, and to reset the enable signal 315 in response to receiving a reset signal 424 synchronized from the release signal ('Done') 314.

Specifically for the illustrated example, the latching component 410 comprises a flip-flop wherein the first input 412 comprises a clock enable input of the flip-flop and the second input 414 comprises a reset input of the flip-flop. A data input 418 of the latching component 410 is arranged to receive a 'set' value, which for the illustrated example comprises a '1' value, and a clock input of the latching component 410 is arranged to receive a clock signal, which for the illustrated example comprises a serial clock signal 255 for the serial interface 250 via which request signals 312 are received. As such, the latching component 410 is synchronized with the requesting clock domain (not shown), and thus with the received request signal 312.

Thus, in this manner, upon the reset signal 424 being 'set' (e.g. to a '1' value) the latching component 410 is forced to reset the value output thereby to, for the illustrated example, a '0' value; thus resetting the enable signal 315 to a '0'. Conversely, when the reset signal 424 is not set, the output of the latching component 410 remains at a '0' value (i.e. the enable signal 315 remains unset) until a request signal 312 is received which enables the clock input and upon the next active edge of the serial clock signal 255 the '1' value at the data input 418 is output and held by the latching component 410 to set the enable signal 315. The enable signal 315 is then held set until the latching component 410 is subsequently forced to reset by the reset signal 424 being set.

The trigger component 310 further comprises a reset component 430. The reset component 430 comprises an input 432 arranged to receive the release signal 314 from the respective functional module 220, and an output 434 arranged to output the synchronous reset signal 424 to the latching component 410. Accordingly, the reset component 430 is arranged to set the reset signal 424 output to the latching component 410 upon receipt of a release signal 314 from the respective functional module 220.

For the illustrated example, the reset component 430 comprises a first latching component 440 comprising: a first input 442 arranged to receive the release signal 314 from the respective functional module 220; a second input 444 arranged to receive a clear value (e.g., a '0' value); a clock input 446 arranged to receive a clock signal, which once again comprises the serial clock signal 255 in the illustrated example; and an output 448 arranged to output, in response to an active clock edge, a 'reset' value upon the release signal 314 being set, and the clear value received at the second input 444 otherwise.

Specifically for the illustrated example, the first latching component 440 of the reset component 430 comprises a flip-flop wherein the first input 442 comprises a 'set' input of the flip-flop, and the second input 444 comprises a data input arranged to receive a '0' value. Thus, in this manner, upon the respective functional module 220 setting the release signal 314, for example to a '1' value, the first latching component 440 is forced to set the value output thereby to, for the illustrated example, a '1' value (the reset value). Conversely, when the release signal 314 is not set, the value '0' (the clear value) received at the data input 444 will be output upon the next active edge of the serial clock signal 255.

The reset component 430 may further comprise one or more further latching components, such as latching component 450, sequentially coupled to the first latching component 440. As illustrated for the latching component 450, such a further latching component may comprise a first input 452 arranged to receive the release signal 314 from the respective functional module 220; a second input 454 arranged to receive the value output by a preceding latching component (e.g. the value output by the first latching component 440 for the illustrated example); a clock input 456 arranged to receive a clock signal, which once again comprises the serial clock signal 255 in the illustrated example; and an output 458 arranged to output, in response to an active clock edge, a reset value upon the release signal 314 being set, and the value output by the preceding latching component received at the second input 454 otherwise. A reset value output by a last of the further latching components (i.e. output by the latching component 450 in the illustrated example) comprises the reset signal 424 output to the latching component 410.

Specifically for the illustrated example, the further latching component 450 of the reset component 430 comprises a flip-flop wherein the first input 452 comprises a 'set' input of the flip-flop, and the second input 454 comprises a data input arranged to receive the value output by the preceding (i.e. first) latching component 440. Thus, in this manner, upon the respective functional module 220 setting the release signal 314, for example to a '1' value, the further latching component 450 is forced to set the value output thereby to, for the illustrated example, a '1' value (the reset value). Conversely, when the release signal 314 is not set, the value output by the preceding latching component 440 will be output upon the next active edge of the serial clock signal 255.

In this manner, upon the respective functional module 220 setting the release signal 314, each of the latching components 440,450 within the reset component 430 is forced to set the value output thereby to, for the illustrated example, a '1' value (the reset value). Accordingly, the reset component 430 is arranged to set the reset signal 424 output to the latching component 410 substantially upon the release signal 314 from the respective functional module 220 being set. However, upon the release signal 314 from the respective functional module 220 subsequently being unset, the reset component 430 is arranged to hold the reset signal 424 in a set state (e.g. comprising a '1' value) for two cycles of the serial clock signal 255 (the number of clock cycles equalling the number of latching elements 440, 450) before synchronously changing the state of the reset signal 424 output to the latching component 410 to an unset state (e.g. comprising a '0' value). Advantageously, upon the release signal 314 being unset, the latching elements 440 and 450 clock the '0' value through the reset component 430 over the two cycles of the serial clock signal 255 in order to release the reset applied to the latching component 410 in a safe manner.

As indicated above, the latching component 410 and the reset component 430 of the trigger component 310 are synchronised with the requesting serial clock signal 255 for the serial interface 250, via which request signals 312 are received. In this manner, since the release signal 314 is synchronised with the reference domain (i.e. the clock domain 210 of the functional modules 220), the reset component 430 synchronises the reset signal 424 with the requesting serial clock signal 255 following the release signal 314 being set, so that the reset signal 424 provided to the latching component 410 is synchronised with request signals 312 received thereby.

In the illustrated example, the reset component 430 is further arranged to receive a Reset_b signal 460, for example a global reset for all of the circuits at power up.

Figure 5:
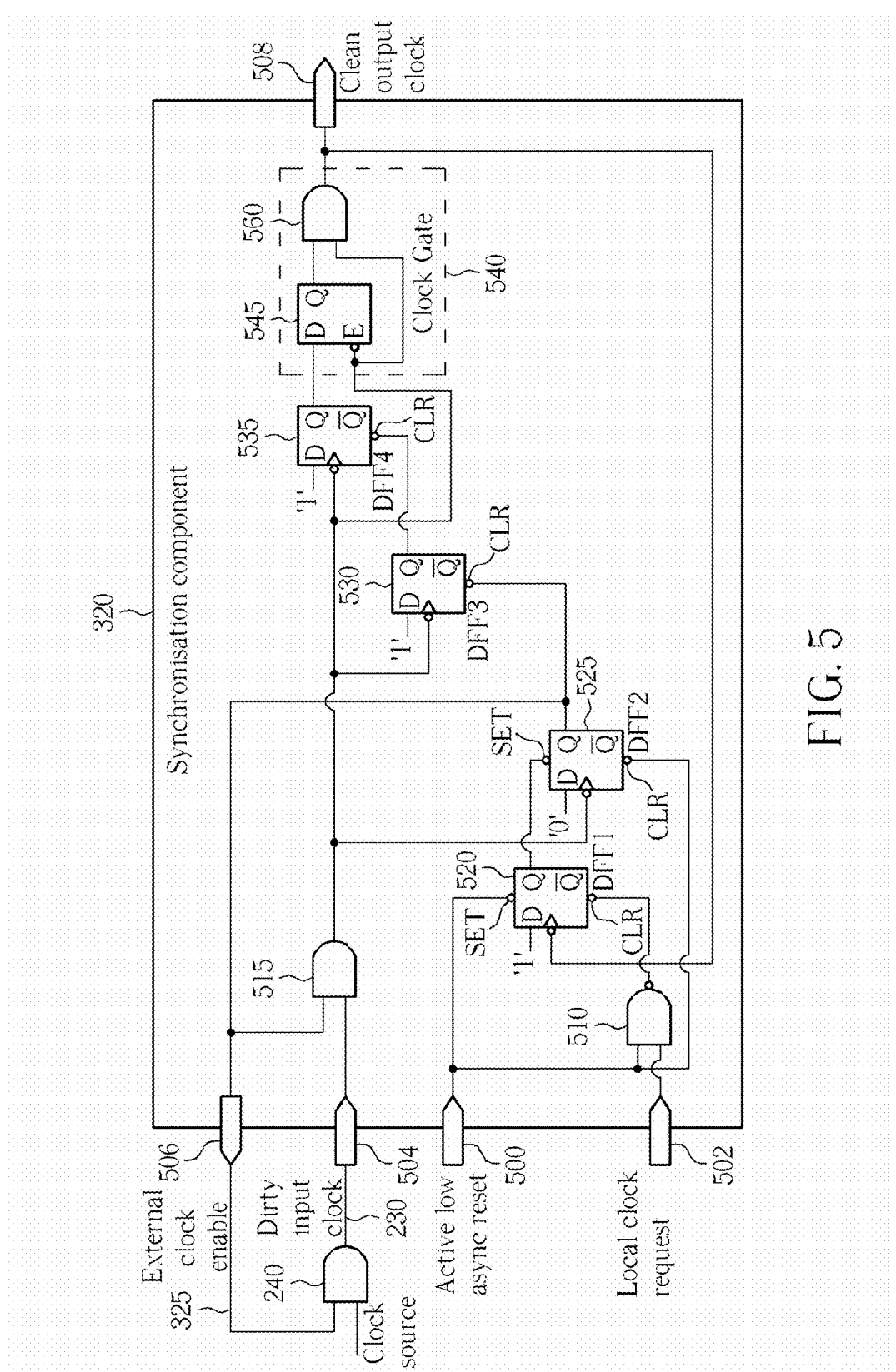
FIG. 5 illustrates a simplified block diagram of an example of a synchronisation component of the synchronisation module of FIG. 3.

Referring now to FIG. 5, there is illustrated a simplified block diagram of an example of a synchronisation component 320. The synchronisation component 320 illustrated in FIG. 5 comprises a first input 502 arranged to receive at least an indication ('Local clock request') of an enable signal 315 output by one or more of the trigger components 310, for example as provided by combinational logic OR gate 330 in FIG. 3. The synchronisation component 320 further comprises a second input 504 arranged to receive a (dirty) reference clock signal ('Dirty input clock') 230 output by clock gating component 240, and a third input 500 arranged to receive a synchronizer reset signal ('Active low async reset'). In addition, the synchronisation component 320 comprises a first output 506 arranged to output a configuration signal to the external clock gating component 240, which for the illustrated example comprises the external clock enable signal ('External clock enable') 325, and a second output 508 arranged to output a 'clean' reference clock signal ('Clean output clock') whereby any runt pulses or the like are cleaned out of the clock signal.

In the illustrated example, the synchronisation component 320 comprises a NAND gate 510. A first input of the NAND gate 510 is operably coupled to the third input 500 of the synchronisation component 320, a second input of the NAND gate 510 is operably coupled the first input 502 of the synchronisation component 320 and an output of the NAND gate 510 is operably coupled to an inverted reset/clear input ('CLR') of a first D-type flip-flop (DFF1) 520. An inverted set input ('SET') of DFF1 520 is operably coupled to the third input 500 of the synchronisation component 320, whilst a data input ('D') of DFF1 520 is arranged to receive a '1' value and a clock input of DFF1 520 is operably coupled to the second output 508 of the synchronisation component 320 and thus arranged to receive the 'clean' reference clock signal output thereby.

An output ('Q') of DFF1 520 is operably coupled to an inverted set input of a second D-type flip-flop (DFF2) 525. An inverted reset/clear input of DFF2 525 is operably coupled to the third input 500 of the synchronisation component 320, whilst a data input of DFF2 525 is arranged to receive a '0' value and a clock input of DFF2 525 is operably coupled to the second input 504 of the synchronisation component 320 via an AND gate 515. An output of DFF2 525 is operably coupled to the first output 506 of the synchronisation component 506 and thus arranged to provide the external clock enable signal 325. The output of DFF2 is also operably coupled to an inverted reset/clear input of a third D-type flip-flop (DFF3) 530. A data input of DFF3 530 is arranged to receive a '1' value and a clock input of DFF3 530 is also operably coupled to the second input 504 of the synchronisation component 320 via AND gate 515. An output of DFF3 530 is operably coupled to an inverted reset/clear input of a fourth D-type flip-flop (DFF4) 535. A data input of DFF4 535 is arranged to receive a '1' value and a clock input of DFF4 535 is also operably coupled to the second input 504 of the synchronisation component 320 via AND gate 515.

A first input of AND gate 515 is operably coupled to the output of DFF2 525, and a second input of AND gate 515 is operably coupled to the second input 504 of the synchronisation component 320, and thus arranged to receive the 'dirty' reference clock signal 230. The output of the AND gate 515 is operably coupled to the clock inputs of DFF2 525, DFF3 530 and DFF4 535. An output of DFF4 and the output of AND gate 515 are also operably coupled to an internal clock gating component (Clock Gate) 540 comprising a latching element 545 and an AND gate 560. Specifically, the output of DFF4 535 is operably coupled to a data input ('D') of the latching element 545, whilst the output of the AND gate 515 is operably coupled to an inverted enable input ('E') of the latching element 545 and a first input of the AND gate 560. An output ('Q') of the latching element 545 is operably coupled to a second input of the AND gate 560, and an output of the AND gate 560 is operably coupled to the output 508 of the synchronisation component 530 and thus arranged to output the 'clean' reference clock signal.

At initial power up, the synchronisation component 320 may be reset, for example via an active low synchronizer reset signal provided to the third input 500 thereof, whereby the synchronisation component 320 is reset to a default state in which the output of DFF1 520 is set to '1' and the output of DFF2 525 is set to '0'. The '0' value output by DFF2 525 in turn holds the output of DFF3 530 at '0', which does the same to the output of DFF4 535.

As previously mentioned, the output of DFF2 525 provides the external clock enable signal 325 to the external gating element 240, which for the illustrated example comprises an AND gate. Accordingly, in the default state of the synchronization component 320 following a reset, the external clock enable signal 325 comprises a '0' value, which configures the gating element 240 to gate off the reference clock signal 230. The combination of this and of the output of DFF4 535 being held at '0' ensures that no clock signal is output by the internal clock gating component 540, and thus that no clock signal is provided to the functional modules 220 or to DFF1 520.

After being reset, and once a synchronizer reset signal provided to the third input 500 of the synchronisation component 320 has been cleared, because no clock signal is provided to DFF1 520, the output of DFF1 520 is held at its default state of '0'; thus the outputs of DFF2, DFF3 530 and DFF4 535 are also held at their respective default states. However, upon receipt of an asynchronous (active high) request at the first input 502 of the synchronisation component 320, for example from the combinational logic OR gate 350 of FIG. 3 indicating at least one of the trigger components 310 has set their respective enable signal 315, the inverted reset/clear input of DFF1 520 is pulled low, causing the output of DFF2 525 to be reset to a '0' value. Notably, the only timing requirement for the asynchronous request signal is that it comprises a sufficiently wide pulse width to meet the minimum reset pulse limit of DFF1 520.

The '0' value now output by DFF1 520 causes the output of DFF2 525 to be set to a '1' value, which is output to the external clock gating component 240, thereby configuring the external clock gating component 240 to enable the 'dirty' reference clock signal 230. At the same time, the '1' value output by DFF2 525 releases the reset on DFF3 530. There should be sufficient delay in the system to ensure the recovery time of DFF3 530 is not violated; the recovery time of a flip flop being the required time that the reset must be stable before a subsequent active clock edge. Such a delay may be implemented within the synthesis process; 'synthesis' being the process of converting a hardware description language design into the actual logic gates that eventually are manufactured on silicon. As long as the output of DFF2 525 is held high at a '1' value, the external clock gating component 240 will be configured to un-gate the reference clock signal 230.

Due to the un-related timing, the reference clock signal 230 will previously have been gated at an arbitrary point in its cycle. Accordingly, un-gating the reference clock signal 230 in response to an asynchronous request signal 312 means that the first pulse of the reference clock signal 230 could comprise any polarity or size. At this time, DFF4 535 is still held reset by DFF3 530, but at the first falling edge of the input clock, DFF3 530 is set to 1.

Although the reset on DFF3 530 is released substantially immediately upon the output by flip-flop DFF2 525 being set to a '1' value, and thus at substantially the same time as the reference clock signal 230 being un-gated, the value output by DFF3 530 will remain a '0' until the first active edge of the now un-gated reference clock signal 230; upon which the '1' value provided to the data input of DFF3 530 will be output by DFF3 530, thereby releasing the reset on DFF4 535. Subsequently, upon the next active edge of the reference clock signal 230, the '1' value provided to the data input of DFF4 535 will be output by DFF4 535, thereby providing a '1' value to the latching element 545 of the internal clock gating component 540. The latching element 545 subsequently outputs the '1' value provided thereto upon the next active edge of the reference clock signal 230, synchronously un-gating the reference clock signal 230 at the AND gate 560. In this manner, the synchronous un-gating of the reference clock signal 230 at the AND gate removes any runt pulses that may have occurred following being un-gated by the external clock gating component 240 in response to an asynchronous request 315. Thus, a 'clean' reference clock signal may be provided to the functional modules 220.

In addition to the clean reference clock signal being provided to the functional modules 220, it is also provided to the clock input of DFF1 520. Accordingly, upon the asynchronous request received at the first input 502 of the synchronizer component 320 being cleared, the reset on DFF1 520 is released. Thus, upon the next active edge of the reference clock signal, the '1' value provided to the data input of DFF1 520 is then output by DFF1 520, releasing the set on DFF2 525. Thus, upon the next active edge of the reference clock signal, the '0' value provided to the data input of DFF2 525 is then output, causing the external clock gating component 240 to again gate the clock reference signal. Furthermore, the '0' value output by DFF2 525 reasserts the reset on DFF3 530, which in turn reasserts the reset on DFF4 535, causing the internal gating component 540 to also gate the clock reference signal. In this manner, the synchronizer component 320 is returned to its default state.

Advantageously, the synchronisation module 300 herein described enables the reference clock signal of the clock domain 210 and the clock signal corresponding to received asynchronous requests (such as the serial clock signal 255) to comprise unrelated phase and frequency, and both to be discontinuous, thereby enabling power and noise reduction to be improved. Furthermore, by enabling the synchronisation module 300 to reset the clock enable signals output by the respective trigger components 310, the gating of the reference clock signal may be substantially maximised, further improving noise and power reduction.

In addition, the synchronisation module 300 herein described enables a simple AND gate or equivalent component to be used to remotely gate the reference clock signal near its source, thereby enabling the effectiveness of such clock gating with regard to power to be maximised without suffering from noise caused by sequential logic.

Furthermore, the low power and noise characteristics provided by the synchronisation module 300 are particularly beneficial for sensitive and power restricted circuits, such as radio frequency (RF) circuits and the like.

Figure 6:
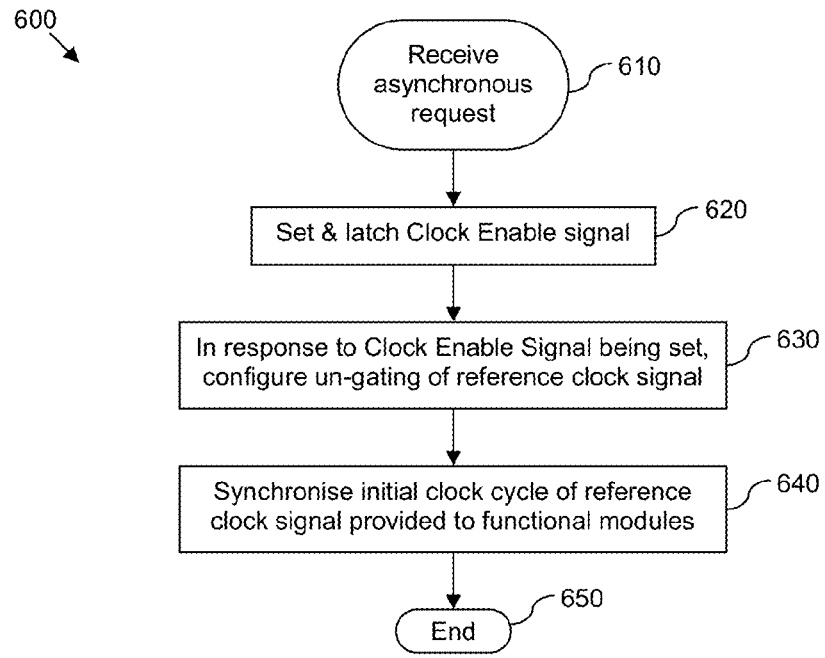
FIGS. 6 and 7 illustrate simplified flowcharts of an example of a method of synchronising an asynchronous clock request.
Figure 7:
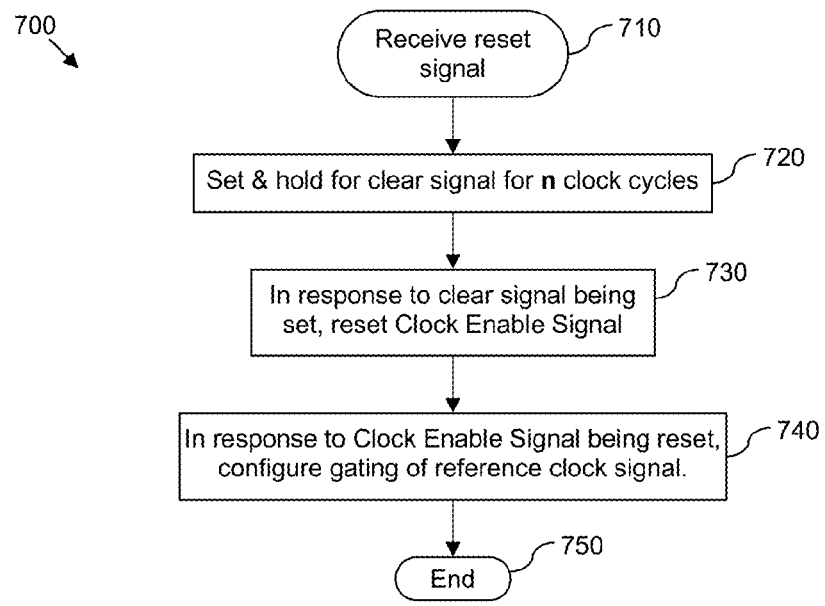

Referring now to FIGS. 6 and 7, there are illustrated simplified flowcharts 600, 700 of an example of a method of synchronising an asynchronous clock request. A first part of the method starts at 610 with the receipt of an asynchronous clock request. Next, at 620, a clock enable signal is set and latched in response to receiving the asynchronous clock request. Un-gating of a reference clock signal is then configured in response to the clock enable signal being set, at 630. An initial clock cycle of the clock reference signal provided to functional modules is then synchronised following the clock reference signal being un-gated, at 640. This part of the method then ends at 650.

A second part of the method starts at 710 with the receipt of a reset signal, for example from a functional module. Next, at 720, a reset signal is set and held for N clock cycles. A clock enable signal is then reset in response to the reset signal being set, at 730. Gating of the reference clock signal is then configured in response to the clock enable being set, at 740, and this second part of the method then ends at 750.

It will be appreciated that, for clarity purposes, the above description has described embodiments of the invention with reference to different functional units and processors. However, it will be apparent that any suitable distribution of functionality between different functional units, for example with respect to the trigger component synchronisation component, may be used without detracting from the invention.

Aspects of the invention may be implemented in any suitable form including hardware, software, firmware or any combination of these. The invention may optionally be implemented, at least partly, as computer software running on one or more data processors and/or digital signal processors or configurable module components such as field programmable gate array (FPGA) devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved synchronisation module and method of operation therefor have been described, wherein the aforementioned disadvantages with prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit device comprising:
   at least one functional module arranged to receive at least one reference clock signal;
   at least one gating component configurable to perform gating of the at least one reference clock signal; and
   at least one synchronisation module;
   the at least one synchronisation module comprises:
   at least one trigger component arranged to receive at least one request for the at least one functional module, the at least one request being asynchronous with the at least one reference clock signal, and to set at least one enable signal for the at least one functional module in response to receiving the at least one request therefor; and
   at least one synchronisation component arranged to receive the at least one enable signal, and in response to the at least one enable signal being set to:
   configure the at least one gating component to un-gate the at least one reference clock signal; and
   synchronize an initial clock cycle of the reference clock signal received by the at least one functional module following the reference clock signal being un-gated.

2. The integrated circuit of claim 1 wherein the at least one trigger component is further arranged to receive at least one release signal from the at least one functional module, and to reset the at least one enable signal for the at least one functional module in response to receiving the at least one release signal therefrom.

3. The integrated circuit of claim 2 wherein the at least one trigger component comprises a latching component comprising:
   a first input arranged to receive the at least one request;
   a second input arranged to receive a reset signal; and
   an output arranged to output the at least one enable signal.

4. The integrated circuit of claim 3 wherein the at least one latching component is arranged to set and latch the at least one enable signal in response to receiving the at least one request, and to reset the at least one enable signal in response to receiving the reset signal.

5. The integrated circuit of claim 1 wherein the at least one synchronisation component is further arranged to configure the at least one gating component to gate the at least one reference clock signal upon no enable signal being set.

6. The integrated circuit of claim 5 wherein the at least one latching component comprises:
- a clock enable input arranged to receive the at least one request;
- a reset input arranged to receive the reset signal; and
- a data input arranged to receive a set value;
- a clock input arranged to receive a clock signal; and
- an output arranged to set/reset the at least one enable signal in accordance with the received input signals.

7. The integrated circuit device of claim 6 wherein the reset component comprises at least a first latching component; the at least a first latching component comprises:
- a first input arranged to receive the at least one release signal from the at least one functional module;
- a second input arranged to receive a clear value;
- a clock input arranged to receive a clock signal; and
- an output arranged to output a reset signal comprising, in response to an active clock edge, a reset value upon receipt of the release signal, and the clear value otherwise.

8. The integrated circuit device of claim 5 wherein the at least one trigger component further comprises a reset component; the reset component comprising:
- an input arranged to receive the at least one release signal from the at least one functional module; and
- an output arranged to output the reset signal;
- wherein the reset component is arranged to output a synchronous reset signal to the trigger component upon receipt of a release signal from the at least one functional module.

9. The integrated circuit device of claim 8 wherein the reset component comprises at least one further latching component sequentially coupled to the at least first latching component; the at least one further latching component comprises:
- a first input arranged to receive the at least one release signal from the at least one functional module;
- a second input arranged to receive a value signal by a previous latching component;
- a clock input arranged to receive a clock signal; and
- an output arranged to output a reset signal comprising, in response to an active clock edge, a reset value upon receipt of the release signal, and the value output by the preceding latching component otherwise;
- wherein a reset signal output by a last of the at least one further latching components comprises a reset signal output to the at least one trigger component.

10. The integrated circuit device of claim 1 wherein the integrated circuit device comprises:
- a plurality of functional modules each arranged to receive at least one reference clock signal;
- at least one gating component configurable to perform gating of the at least one reference clock signal; and
- at least one synchronisation module.

11. The integrated circuit device of claim 10 wherein the at least one synchronisation module comprises a plurality of trigger components, with a number of the trigger component(s) arranged to receive at least one request for at least one of the functional modules, and to set at least one enable signal for the at least one functional module in response to receiving the at least one request therefor.

12. The integrated circuit device of claim 11 wherein the at least one synchronisation module further comprises at least one synchronisation component arranged to receive at least an indication of at least one enable signal being set by at least one of the trigger components, and in response to at least one enable signal being set to:
- configure the at least one gating component to un-gate the at least one reference clock signal; and
- synchronize an initial clock cycle of the reference clock signal received by the at least one functional module following the reference clock signal being un-gated.

13. The integrated circuit of claim 12 wherein the at least one synchronisation module comprises a combinational logic (N)OR gate arranged to receive enable signals output by the plurality of trigger components, and to output to the at least one synchronisation component an indication of whether at least one trigger component has set an enable signal.

14. The integrated circuit of claim 1 wherein the at least one gating component is configurable to perform gating of the at least one reference clock signal remotely upstream of the at least functional module.

15. The integrated circuit of claim 14 wherein the at least one gating component is located proximate to a generator component for the at least one reference clock signal.

16. The integrated circuit of claim 1 wherein the at least one gating component comprises at least one of a combinational logic gate and an enabled buffer.

17. The integrated circuit of claim 1 wherein the synchronisation component comprises:
- a first input arranged to receive at least an indication of an enable signal output by the at least one trigger component;
- a second input arranged to receive the at least one reference clock signal output by the at least one clock gating component;
- a first output arranged to output at least one configuration signal to the at least one clock gating component; and
- a second output arranged to output a clean clock reference signal.

18. A synchronisation module comprising:
- at least one trigger component arranged to receive at least one request for at least one functional module, the at least one request being asynchronous with at least one reference clock signal of the at least one functional module, and to set at least one enable signal for the at least one functional module in response to receiving the at least one request therefor; and
- at least one synchronisation component arranged to receive the at least one enable signal, and in response to the at least one enable signal being set to:
  - configure at least one gating component to un-gate the at least one reference clock signal; and
  - synchronize an initial clock cycle of the reference clock signal received by the at least one functional module following the reference clock signal being un-gated.

19. An electronic device comprising:
- at least one functional module arranged to receive at least one reference clock signal;
- at least one gating component configurable to perform gating of the at least one reference clock signal; and
- at least one synchronisation module;
- the at least one synchronisation module comprises:
- at least one trigger component arranged to receive at least one request for the at least one functional module, the at least one request being asynchronous with the at least one reference clock signal, and to set at least one enable signal for the at least one functional module in response to receiving the at least one request therefor; and
- at least one synchronisation component arranged to receive the at least one enable signal, and in response to the at least one enable signal being set to:
  - configure the at least one gating component to un-gate the at least one reference clock signal; and synchronize an initial clock cycle of the reference clock signal received by the at least one functional module following the reference clock signal being un-gated.

20. A method of synchronising an asynchronous clock request, the method comprising:
receiving at least one request for at least one functional module, the at least one request being asynchronous with at least one reference clock signal of the at least one functional module;
setting at least one enable signal for the at least one functional module in response to receiving the at least one request therefor; and
in response to the at least one enable signal being set:
configuring at least one gating component to un-gate the at least one reference clock signal; and
synchronising an initial clock cycle of the at least one reference clock signal.

* * * * *